(12) United States Patent
Bollu

(10) Patent No.: US 8,077,538 B2
(45) Date of Patent: *Dec. 13, 2011

(54) ADDRESS DECODER AND/OR ACCESS LINE DRIVER AND METHOD FOR MEMORY DEVICES

(75) Inventor: Vikram Bollu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/833,763

(22) Filed: Jul. 9, 2010

(65) Prior Publication Data

US 2010/0278003 A1     Nov. 4, 2010

Related U.S. Application Data

(63) Continuation of application No. 12/148,745, filed on Apr. 21, 2008, now Pat. No. 7,768,865.

(51) Int. Cl.
*G11C 8/00* (2006.01)

(52) U.S. Cl. ......... 365/230.08; 365/230.07; 365/230.06; 365/226

(58) Field of Classification Search ............ 365/230.06, 365/230.07, 230.08, 226
See application file for complete search history.

(56) References Cited

U.S. PATENT DOCUMENTS

| 5,039,882 | A  | * | 8/1991  | Arakawa ................... 326/106 |
| 5,742,546 | A  | * | 4/1998  | Devin ....................... 365/194 |
| 6,343,031 | B1 |   | 1/2002  | Murata ...................... 365/104 |
| 7,466,596 | B2 | * | 12/2008 | Ausserlechner et al. 365/185.23 |
| 7,768,865 | B2 | * | 8/2010  | Bollu ...................... 365/230.06 |

\* cited by examiner

*Primary Examiner* — Pho M Luu

(74) *Attorney, Agent, or Firm* — Dorsey & Whitney LLP

(57) ABSTRACT

Address decoders and access line drivers are provided. One such row decoder and access line driver receives power supply voltages in a manner that prevents CHC damage and avoids GIDL currents in transistors in the decoder and driver. The row decoder and a latch in the driver are powered by a first supply voltage, and an output stage in the access line driver is powered by a second supply voltage. The first and second supply voltages are maintained at a relatively low level during standby before an address is decoded. Only after an address is decoded to set the latch are the supply voltages increased to levels needed to drive the access line. Further, before resetting the latch, the first and power supply voltages are decreased to their standby levels. By maintaining the first and second voltages relatively low until after the latch is set and reset, GIDL currents may be avoided and CHC damage may be prevented.

20 Claims, 4 Drawing Sheets ated as U.S. Pat. No. 7,768,865 on Aug. 3, 2010. This application and patent are incorporated herein by reference in their entirety, and for any purposes.

TECHNICAL FIELD

This invention relates to memory device circuits, and, more specifically, in one or more embodiments to a row decoder and word line driver for memory devices.

BACKGROUND OF THE INVENTION

Memory devices typically include an array of memory cells arranged in rows and columns. The memory cells in each of the rows are normally activated by applying an activation signal to an access line, commonly referred to in the art as a word line, for their respective row. The activation signal is normally generated by a row address decoder, which decodes addresses received by the memory device.

A typical prior art row address decoder 10 and word line driver 20 is shown in FIG. 1. The row address decoder 10 includes four NMOS transistors 12-18 having their drains and sources connected in series with each other. The gates of the transistors 12-18 each receive a respective bit of a row address or another signal corresponding to a row address bit. The source of the first transistor 12 also receives and decodes a bit. More specifically, the source of the transistor 12 receives an LsecF signal, which is an active low bit corresponding to a section of a memory array containing a plurality of rows. The gate of the transistor 12 receives a global phase signal GPH corresponding to the most significant bit of the row addresses in the respective section. The gate of the next transistor 14 receives a signal RB, which corresponds to the next to least significant bit of a row address. Finally, the gate of the transistor 16 receives a signal RA, which corresponds to the least significant bit of a row address. The remaining transistor 18 in the row address decoder 10 is connected to a supply voltage $V_{CC}$, which maintains the transistor 18 in a conductive state. The function of the transistor 18 will be explained below.

In operation, a specific row corresponding to the row address decoder 10 is decoded when the section signal LsecF for that row is active low, and the global phase signal and the row bits GPH, RB, RA, respectively, for that row are active high. In such case, the row address decoder 10 outputs an active low signal Pc. In all other cases, the output of the row address decoder 10 is in a high state. Although the row address decoder 10 shown in FIG. 1 decodes only a section bit, a global phase signal, and two row address bits, it will be understood that row address decoders having similar typography are in use to decode a fewer or greater number of row address bits and other signals corresponding to or derived from address bits.

The word line driver 20 performs the function of generating a high word line signal WL responsive to receiving an active low signal Pc from the decoder 10. The word line driver 20 includes a PMOS transistor 22 receiving an active low precharge signal GPcF, and a latch 24 formed by a pair of cross-coupled PMOS transistors 26, 28. The PMOS transistor 28, in combination with an NMOS transistor 30, forms an output stage that drives the word line WL. All of the transistors except for the NMOS transistor 30, have their sources connected to a precharge supply voltage $V_{CC}$pr, which is a pumped voltage above the supply voltage $V_{CC}$.

In operation, the latch 24 is reset at the end of a row access by the transistor 22 receiving an active low precharge signal GPcF, which turns off the PMOS transistor 28, and turns ON the NMOS transistor 30 to drive the word line WL low. The low word line voltage turns ON the PMOS transistor 26 to maintain the voltage applied to the gate of the NMOS transistor 30 high.

When the row address decoder 10 decodes a row address for the respective row, the decoder 10 outputs a low Pc signal. This low Pc signal sets the latch 24 by pulling the gate of the PMOS transistor 28 low to turn ON the transistor 28 and drive the word line WL high. The low Pc signal also turns OFF the NMOS transistor 30. At the same time, the high word line voltage turns OFF the PMOS transistor 26. The high voltage of the WL then activates the memory cells (not shown) in the row to which the word line WL is connected. As explained above, at the end of the access, the precharge signal GPcF is driven active low to reset the latch 24 and place the word line driver 20 in the original state.

As indicated above, the row address decoder 10 includes an NMOS transistor 18 that is turned ON by the supply voltage $V_{CC}$ being applied to its gate. The function of the transistor 18 is to reduce the effects of channel hot carriers "CHC" on the transistors 12-16. The CHC phenomena occurs when current begins to flow through a transistor with a high drain-to-source voltage. In such case, the high drain-to-source voltage causes the electrons flowing through the transistor to accelerate to a high velocity. The high velocity of these electrons may cause them to be injected into the gate oxide of the transistor, thereby resulting in damage to the gate oxide. Insofar as a high drain-to-source voltage maximizes the CHC damage, the danger of CHC damage is generally at its worst as the transistor becomes conductive. If the drain of the transistor 16 was connected directly to the latch 24, then the drain of the transistor 16 would be at the precharge supply voltage $V_{CC}$pr when the row address decoder 10 began to decode an address since the latch 24 would then be reset. In such case, the source of one or more of the transistors 12-16 would be low when the transistors 12-16 turn ON, thereby placing the full magnitude of the precharge supply voltage $V_{CC}$pr across one or more of the transistors 12-16 as the transistors 12-16 are turned ON. As a result, the transistors 12-16 could be damaged by the CHC phenomena. The presence of the transistor 18 maintains the voltage on the drain of the transistor 16 at the supply voltage $V_{CC}$ less the threshold voltage $V_T$ of the transistor 18 when the latch 24 is reset. This reduced gate-to-source voltage of the transistor 16 avoids CHC damage in the transistors 12-16.

The prior art row decoder 10 and word line driver 20 shown in FIG. 1 has, in the past, provided acceptable performance. However, as memory densities increase, the row pitch, i.e., the spacing between rows, makes it more difficult to accommodate the CHC protection transistor 18. Furthermore, when the latch 24 is in a reset condition to hold the voltage of the word line WL low, the high drain-to-source voltage of the transistor 28 when it turns ON can cause CHC damage to the transistor 28. Similarly, when the latch is in a set condition, the voltage on the gate of the transistor 30 is low and the voltage of the word line WL is high. In such case, the gate-to-source voltage of the transistors 22, 30, 26 is equal to the precharge supply voltage $V_{CC}$pr so that CHC damage to these transistors can occur when the output of the row address decoder 10 transitions low in response to decoding a row address.

Another limitation of the word line driver 20 shown in FIG. 1 is a relatively slow switching time and high power consumption of the transistors 28, 30. The word line WL is normally relatively long thereby causing it to have a substantial capacitance. As a result, it can require a considerable period for the transistor 28 to drive the word line WL from low-to-high. This delayed transition can limit the operating speed of a memory device. The delayed transition also maintains the PMOS transistor 26 ON for a considerable period so that it is unable to turn OFF the PMOS transistor 28. As a result, both the PMOS transistor 28 and the NMOS transistor 30 are on for a considerable period thus resulting in considerable current flow through these transistors 28, 30, which results in a high power consumption.

Still another limitation of the word line driver 20 may be excessive gate-induced drain leakage (GIDL). Gate-induced drain leakage results in current flowing between the drain and the substrate of a MOSFET transistor that is in a non-conductive state when the gate voltage of the transistor is too high. This GIDL current is the result of a high electric field developed in an area of the substrate where the gate overlaps the drain of the transistor. This GIDL current is undesirable for a variety of reasons. In the word line driver 20 of FIG. 1, the voltage on the gate of the PMOS transistor 28 is substantially equal to the precharge power supply voltage $V_{CC}$pr when the latch 24 is in a reset state so that the word line WL is not being driven. This precharge power supply voltage $V_{CC}$pr can be large enough to result in undesirable GIDL current in the transistor 28. For essentially the same reason, GIDL current can flow through the transistors 22, 26 when the latch 24 is in a set state.

There is therefore a need for a row decoder and/or word line driver that provides fast response time, avoids CHC damage to the transistors in the row decoder and/or word line driver and/or avoids generating GIDL currents in the transistors in the row decoder and/or word line driver.

DETAILED DESCRIPTION

Figure 1:
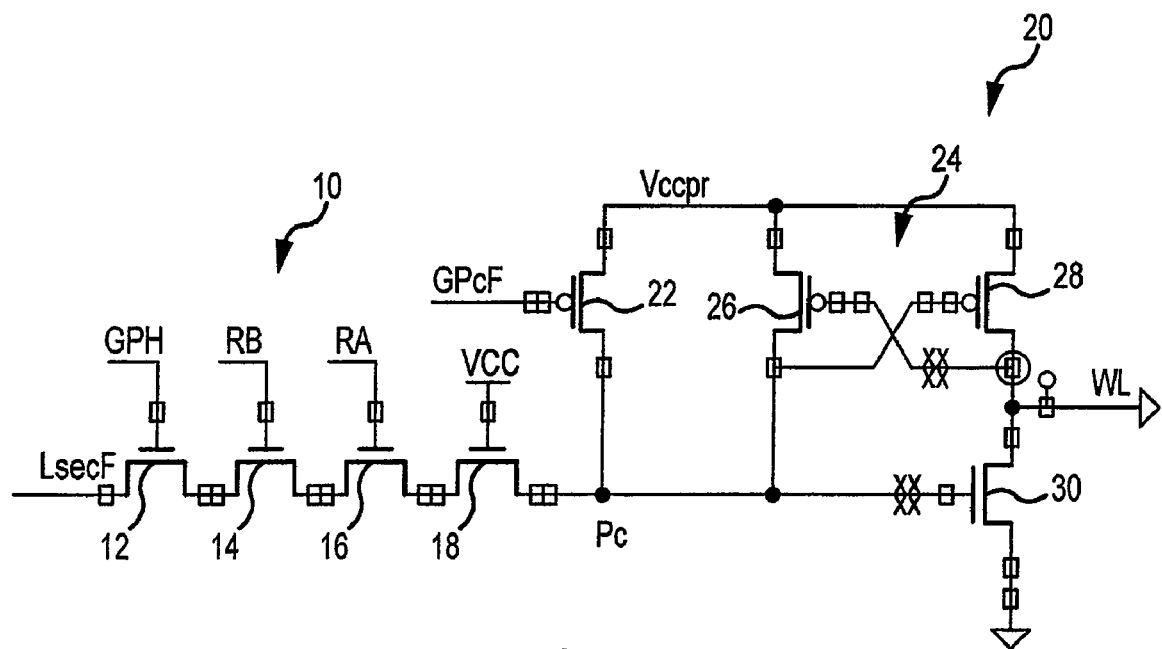
FIG. 1 is a schematic diagram of a typical prior art row decoder and word line driver.
Figure 2:
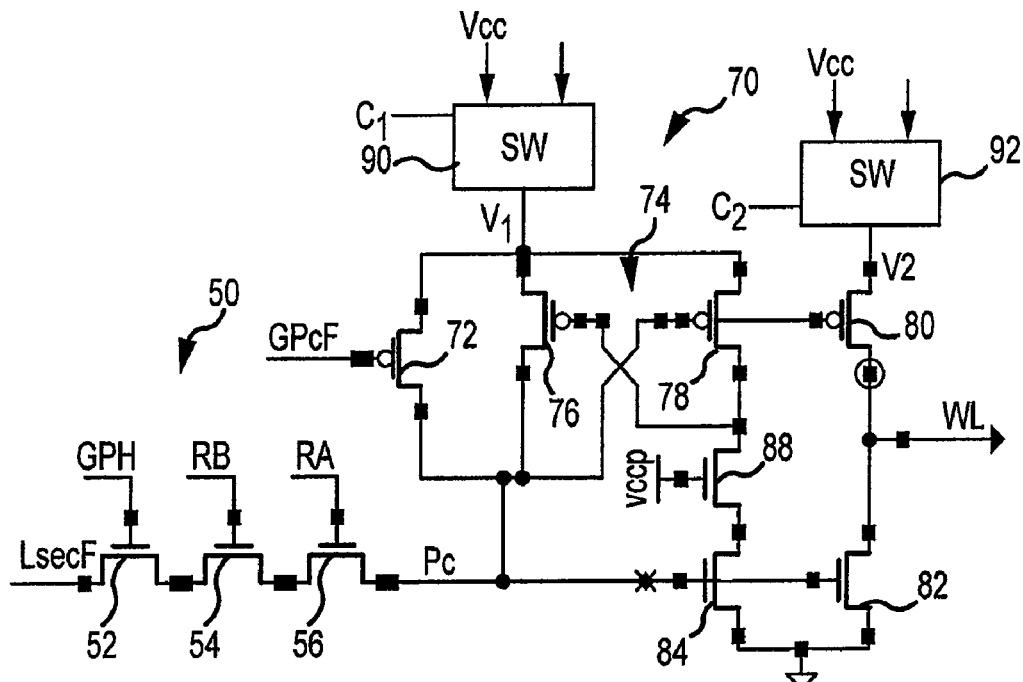
FIG. 2 is a schematic diagram of a row decoder and word line driver according to one embodiment of the invention.

A row address decoder 50 and word line driver 70 according to one embodiment of the invention is shown in FIG. 2. The row decoder 50 includes three NMOS transistors 52, 54, 56 that performs the same function, uses the same signals, and operates in the same manner as the transistors 12, 14, 16 in the row decoder 10 of FIG. 1. The row decoder 50 differs from the row decoder 10 in avoiding the need for the CHC protection transistor 18 often required in the row decoder 10. Instead of using the CHC protection transistor 18, the row decoder 50 avoids CHC problems in a manner that will be described below.

The word line driver 70 is also somewhat similar to the word line driver 20 of FIG. 1. Specifically, the word line driver 70 includes a PMOS transistor 72 that receives the same signal and performs the same function as the transistor 22, and a latch 74 formed by PMOS transistors 76, 78 that perform some of the same functions as the latch 24 formed by the PMOS transistors 26, 28. However, the PMOS transistor 78 in the latch 74 is not also used as an output transistor to drive the word line WL. Instead, the output Pc of the row decoder 50 that is connected to the gate of the PMOS transistors 78 is also connected to a separate PMOS output transistor 80. Similarly, the output Pc of the row decoder 50 is connected to the gate of a separate NMOS output transistor 82 in addition to an NMOS transistor 84 that is connected to the drain of the PMOS transistor 78. In the word line driver 70, the transistor 84 is connected to the drain of the transistor 78 through an NMOS transistor 88 that receives a pumped supply voltage vccp at its gate. The word line driver 70 also differs from the word line driver 20 in using a power supply voltage $V_2$ to power the output transistor 80 that is different from a power supply voltage that $V_1$ is used to power the latch 74 and the transistor 72. These voltages $V_1$ and $V_2$ are provided by respective power supply switches 90, 92 that receive respective control signals $C_1$, $C_2$. Depending on the state of these control signals $C_1$, $C_2$, the power supply switches 90, 92 apply one of two received power supply voltages $V_{CC}$, $V_{CCP}$ to respective nodes of the word line driver 70. As explained in greater detail below, powering different nodes of the word line driver 70 with different voltages allows CHC and GIDL problems to be avoided. Further, by using a PMOS output transistor 80 that is separate from the transistor 78 used in the latch 74, the word line driver 70 may be able to activate the word line WL substantially faster than the word line driver 20 shown in FIG. 1, and it may be able to use substantially less power.

Figure 3:
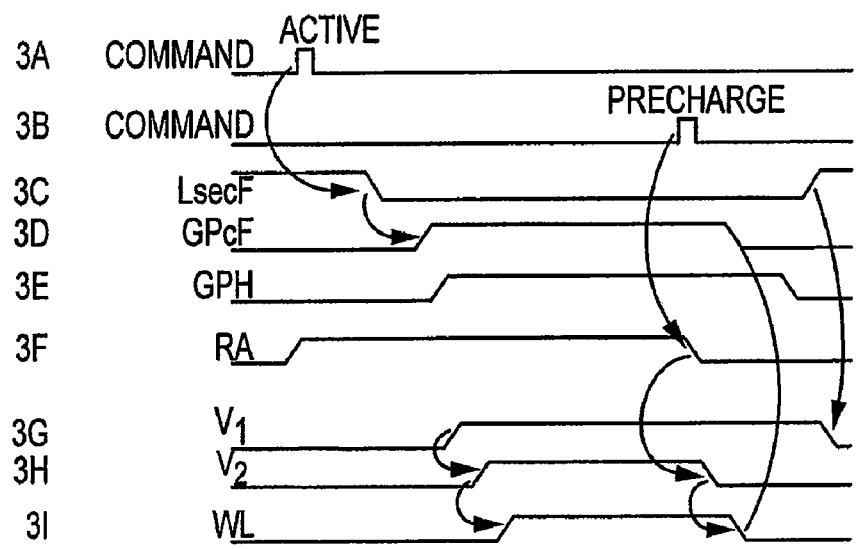
FIG. 3 is a timing diagram showing some of the voltages present in the row decoder and word line driver of FIG. 2.

In operation, during standby before a row address has been decoded, the power supply switch 90 applies the supply voltage $V_{CC}$ to the transistors 72 and the latch 74. As explained below, this voltage $V_{CC}$ is relatively low, but is nevertheless sufficient since it need only be large enough to turn ON the NMOS transistors 82, 84. The subsequent operation will now be explained with reference to the timing diagram shown in FIG. 3. As shown in FIGS. 3G and 3H, during standby the power supply switches 90, 92 supply $V_{CC}$ to the word line driver 70, which is relatively low compared to the $V_{CCP}$ voltage. The PMOS transistor 76 is ON during standby because its gate is pulled low through the transistor 88 by the ON NMOS transistor 84. As a result, this relatively low voltage $V_{CC}$ is applied to the gates of the transistors 78, 80 thereby minimizing GIDL current flow in the transistors 78, 80. This reduced voltage $V_{CC}$ supplied by the transistor 76 also allows the row decoder 50 to perform its decoding function more quickly since the output Pc of the row decoder 50 need only transition through a relatively small voltage range, i.e., $V_{CC}$ to 0 volts.

When an Active command is received as shown in FIG. 3A, the row address bit RA is decoded as shown in FIG. 3F, as is the RB bit although not shown in FIG. 3. The active low section signal LsecF transitions low as shown in FIG. 3C. However, the output Pc of the row decoder 50 does not yet transition low because it continues to be held high by the transistor 72, which remains ON because of the low precharge signal GPcF as shown in FIG. 3D, and because the group phase signal GPH is still low, as shown in FIG. 3E. However, shortly thereafter, the GPcF signal transitions high to allow the Pc output of the decoder 50 to transition low, and the GPH signal transitions high to pull the Pc output to ground. Since the relatively low $V_{CC}$ voltage was applied to the drain of the NMOS transistor 56 during standby, when the transistors 52, 54, 56 decode a group phase signal and a row address, the source-to-drain voltage of the transistor 56 is relatively low, thereby avoiding CHC damage to the transistor 56. The inventor believes that it is for this reason that the CHC protection transistor 18 used in the row decoder 10 is not required in the row decoder 50. By dispensing with the need for the CHC protection transistor 18, the pitch of the word lines WL can be relatively low.

When the output Pc of the row decoder 50 transitions low as explained above, it turns ON the PMOS transistors 78, 80 and turns OFF the NMOS transistors 82, 84. However, since a relatively low voltage $V_{CC}$ was applied to the source of the PMOS transistor 78 during standby, the source-to-drain voltage of the transistor 78 is relatively low when the transistor 78 turns ON. As a result, CHC damage to the transistor 78 is avoided. Similarly, since the power supply switch 92 couples the relatively low supply voltage $V_{CC}$ to the source of the PMOS transistor 80 during standby, the source-to-drain voltage of the transistor 80 is also relatively low. As a result, CHC damage to the transistor 80 is avoided when the transistor 80 turns ON to drive the word line WL.

As shown in FIG. 3G, after the GPH signal transitions high to allow the transistors 78, 80 to be turned ON, the power supply switch 90 switches the voltage $V_1$ from $V_{CC}$ to $V_{CCP}$, which is a pumped voltage having a magnitude greater than $V_{CC}$. However, since the transistor 78 is by then already turned ON, CHC damage to the transistor 78 may be avoided. Similarly, when the power supply switch 92 subsequently increases the voltage $V_2$ from $V_{CC}$ to $V_{CCP}$, the transistors 80 has already turned ON, thereby avoiding CHC damage to the transistor 80. As shown in FIG. 3I, when the transistor 80 is turned ON by the low $P_C$ signal, the word line WL is driven high to activate a row of memory cells.

Dividing the word line driver 70 into two different sections also results in faster operation. As mentioned above, word lines WL used in memory devices are generally very long and thus have substantial capacitance. As further explained above, this capacitance causes very slow switching of the latch 24 used in the word line driver 20 of FIG. 1. However, the transistor 78 of the latch 74 used in the word line driver 70 drives only the gate of the PMOS transistor 76 and the drain of the NMOS transistor 88. As a result, the latch 74 can switch very quickly. Therefore, the latch 74 very quickly applies 0 volts to the gates of the PMOS transistor 80 and the NMOS transistor 82. The PMOS transistor 80 then turns ON much faster than the PMOS transistor 28 in the word line driver 20 turns ON, and the NMOS transistor 82 turns OFF much faster that the NMOS transistor 30 in the word line driver 20 turns OFF. Similarly, the latch 24 in the driver 20 cannot be reset until the NMOS transistor 30 is turned ON sufficiently to pull the gate of the transistor 26 sufficiently low. Yet this transition is slowed by the capacitance of the word line WL. In the word line driver 70, the gate of the transistor 76 in the latch 74 can be very quickly pulled down sufficiently to turn the transistor 76 ON because the NMOS transistor 84 need not drive the word line WL. As a result, transistor 76 can very quickly turn OFF the PMOS transistors 78, 80 and quickly turn ON the NMOS transistor 82. The faster switching times of the transistors 80, 82 has not only the benefit of providing faster performance, but, since the period of time that both transistors 80, 82 are ON may be reduced, power consumption may be also reduced.

With further reference to FIG. 3, a precharge command is subsequently provided, as shown in FIG. 3B. A short time later, the group phase signal GPH transitions low to reset the latch 74 and turn ON the NMOS transistors 82, 84. Resetting the latch also turns OFF the PMOS transistor 80 to allow the word line WL to be driven low by the transistor 82. However, before the GPH signal transitions low, the power supply switch 92 switches the voltage $V_2$ from $V_{CCP}$ to $V_{CC}$ as shown in FIG. 3H, thereby reducing the voltage of the word line WL. As a result, when the NMOS transistor 82 turns ON, the source-to-drain voltage of the transistor 82 is relatively low, thereby avoiding CHC damage to the transistor 82. The word line WL thus transitions low in two stages; first from $V_{CCP}$ to $V_{CC}$, and then from $V_{CC}$ to ground.

Similarly, the power supply switch 90 switches the voltage $V_1$ from $V_{CCP}$ to $V_{CC}$, as shown in FIG. 3G. This has the effect of reducing the source-to-drain voltage of the PMOS transistors 72, 76 before they are turned ON. Therefore, when the transistors 72, 76 do turn ON as the GPH signal transitions low and the latch 74 is reset, the source-to-drain voltage of the transistors 72, 76 is sufficiently low to avoid CHC damage. CHC damage to the NMOS transistor 84 is avoided because the NMOS transistor 88 limits the voltage applied to the drain of the transistor 84 to $V_{CCP}$ less the threshold voltage $V_T$ of the transistor 84.

Dividing the word line driver 70 into two sections and then separately powering them with two different switchable supply voltage levels may thus not only avoid GIDL and CHC problems, but it may also result in faster operation in certain applications.

Figure 4:
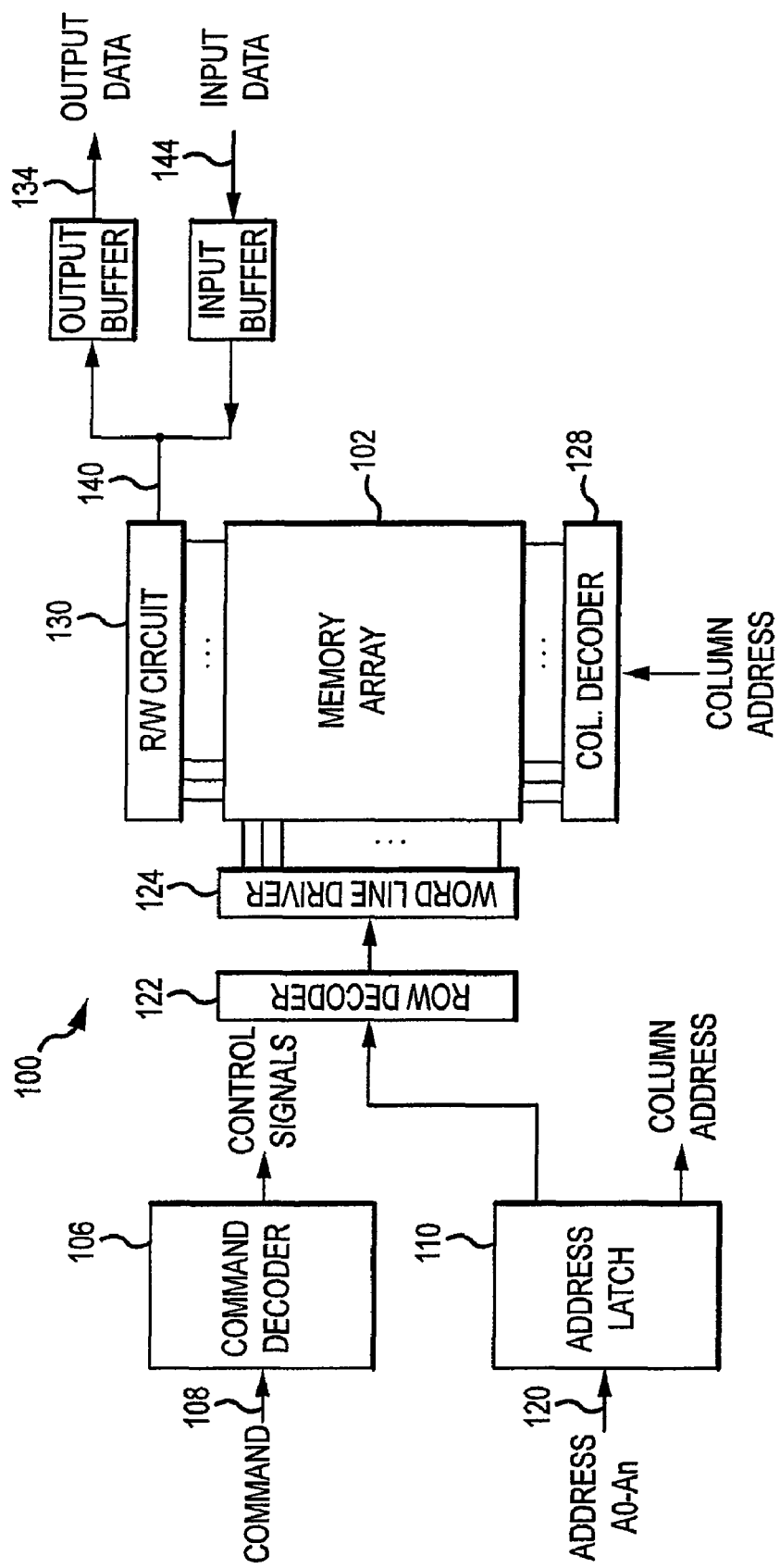
FIG. 4 is a block diagram of an embodiment of a memory device using the row decoder and word line driver of FIG. 2 or a row decoder and/or word line driver according to some other embodiment of the invention.

FIG. 4 illustrates a portion of a memory device 100 according to an embodiment of the present invention. The memory device 100 includes an array 102 of memory cells, which may be, for example, DRAM memory cells, SRAM memory cells, flash memory cells, or some other types of memory cells. The memory device 100 includes a command decoder 106 that receives memory commands through a command bus 108 and generates corresponding control signals within the memory device 100 to carry out various memory operations. Row and column address signals are applied to the memory device 100 through an address bus 120 and provided to an address latch 110. The address latch then outputs a separate column address and a separate row address.

The row and column addresses are provided by the address latch 110 to a row address decoder 122 and a column address decoder 128, respectively. The column address decoder 128 selects bit lines extending through the array 102 corresponding to respective column addresses. The row address decoder 122 is connected to word line driver 124 that activates respective rows of memory cells in the array 102 corresponding to received row addresses. The row address decoder 122 and/or word line driver 124 may be the row address decoder 50 and/or word line driver 70 of FIG. 2 or a row address decoder and/or word line driver according to some other embodiment of the invention.

The selected data line (e.g., a bit line or bit lines) corresponding to a received column address are coupled to a read/write circuitry 130 to provide read data to a data output buffer 134 via an input-output data bus 140. Write data are applied to the memory array 102 through a data input buffer 144 and the memory array read/write circuitry 130. The command decoder 106 responds to memory commands applied to the command bus 108 to perform various operations on the memory array 102. In particular, the command decoder 106 is used to generate internal control signals to read data from and write data to the memory array 102.

Figure 5:
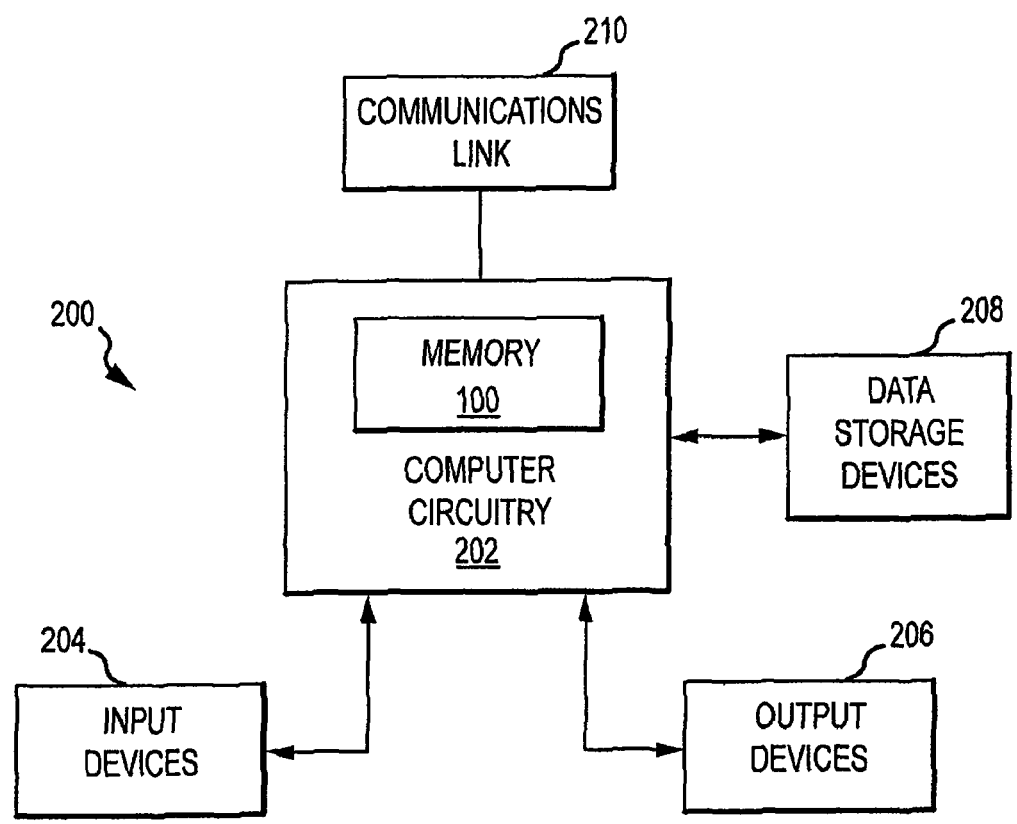
FIG. 5 is a block diagram of a processor-based system using the memory device of FIG. 4 or a memory device according to some other embodiment of the invention.

FIG. 5 is a block diagram of a processor-based system 200, including computer circuitry 202 that contains the memory device 100 of FIG. 4 or a memory device according to some other embodiment of the invention. The computer circuitry 202 performs various computing functions, such as executing specific software to perform specific calculations or tasks. In addition, the processor-based system 200 includes one or more input devices 204, such as a keyboard, coupled to the computer circuitry 202 to allow an operator to interface with the processor-based system. Typically, the processor-based system 200 also includes one or more output devices 206 coupled to the computer circuitry 202, such output devices typically being a display device. One or more data storage devices 208 are also typically coupled to the computer circuitry 202 to store data or retrieve data. Examples of storage devices 208 include hard disks and non-volatile memory. The processor-based system 200 also includes a wireless communication link 210 through which the computer circuitry can send and receive data through a wireless medium. The computer circuitry 202 is typically coupled to the memory device 100 through appropriate address, data, and control busses to provide for writing data to and reading data from the memory device 100.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory comprising:
an address decoder configured to receive address signals to be decoded and generate an active signal responsive to decoding the address signals;
a word line driver coupled to the address decoder, the word line driver configured to receive the active signal and drive an access line to an active level responsive to receipt of the active signal; and
at least one power supply switch coupled to the word line driver, the power supply switch configured to couple a first power supply to the word line driver at a time before the address signals have been decoded by the address decoder, and the power supply switch further configured to couple a second power supply to the word line driver at a time after the address signals have been decoded.

2. The memory of claim 1, wherein the active signal comprises a low logic state.

3. The memory of claim 1, wherein the magnitude of a voltage transition of the access line is smaller than the magnitude of the voltage of the second power supply.

4. The memory of claim 1, wherein a voltage of the first power supply has a lower magnitude than a voltage of the second power supply.

5. The memory of claim 1, wherein the power supply switch is further configured to be toggled by a control input.

6. The memory of claim 1, wherein the address decoder is further configured to generate an active signal, at least in part, responsive to a precharge signal.

7. A decoder comprising:
a row decoder coupled to a precharge output bus and configured to receive at least one of a plurality of inputs from at least one of a plurality of input busses and generate an output signal on the precharge output bus responsive to decoding the at least one of the plurality of inputs;
a latch circuit coupled to the precharge output bus and configured to maintain a first logic state on the precharge output bus responsive to an inactive precharge signal;
an output circuit having an array output and coupled to the latch circuit, the output circuit configured to drive a logic state of the array output responsive to the precharge output bus having a second logic state; and
a first voltage supply circuit coupled to the latch circuit and configured to supply power to the latch circuit at a first voltage and a second voltage.

8. The decoder of claim 7, wherein the first voltage supply circuit is further configured to provide the second voltage responsive to a control signal.

9. The decoder of claim 7, further comprising:
a second voltage supply circuit coupled to the output circuit and configured to supply power to the output circuit at a third voltage and a fourth voltage.

10. The decoder of claim 7, wherein the output circuit is coupled to a memory.

11. The decoder of claim 7, further comprising:
an address latch coupled to the at least one of a plurality of busses;
wherein the row decoder is further configured to receive the at least one of a plurality of inputs from the address latch.

12. The decoder of claim 7, wherein the output circuit is further configured to drive a high logical state responsive to the decoder outputting a low logical state.

13. The decoder of claim 7, wherein at least one of the plurality of inputs is configured to reset a logic state of the latch circuit.

14. A method for accessing a memory device, the method comprising:
applying a first power supply voltage to a word line driver;
decoding a memory address during at least a portion of time the first power supply voltage is applied to the word line driver; and
after decoding the memory address, applying a second power supply voltage, different from the first power supply voltage, to the word line driver.

15. The method of claim 14, wherein said applying a second power supply voltage occurs responsive to the receipt of a control signal.

16. The method of claim 14, further comprising:
after applying the second power supply voltage, providing a precharge signal to the word line driver.

17. The method of claim 14, further comprising:
outputting a logic state from the word line driver responsive to decoding a memory address.

18. The method of claim 14, wherein the first power supply voltage has a lower magnitude than the second power supply voltage.

19. The method of claim 14, wherein said applying a second power supply voltage occurs, at least in part, responsive to receiving a precharge signal.

20. The method of claim 14, further comprising:
after decoding a memory address, latching the output of the word line driver.

* * * * *